(12) United States Patent
Reymond

(10) Patent No.: US 9,945,691 B2
(45) Date of Patent: Apr. 17, 2018

(54) MAGNETIC ANGULAR SENSING SYSTEM WITH SIDE-SHAFT MOUNTED SENSOR AND THE METHOD THEREOF

(71) Applicant: Monolithic Power Systems, Inc., San Jose, CA (US)

(72) Inventor: Serge Reymond, Geneva (CH)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 15/267,119

(22) Filed: Sep. 15, 2016

(65) Prior Publication Data

US 2017/0074680 A1    Mar. 16, 2017

(30) Foreign Application Priority Data

Sep. 16, 2015   (EP) .................................... 15185514

(51) Int. Cl.
  *G01D 5/14*   (2006.01)
  *G01B 7/30*   (2006.01)
  *G01R 33/07*  (2006.01)

(52) U.S. Cl.
  CPC ............. *G01D 5/145* (2013.01); *G01B 7/30* (2013.01); *G01R 33/072* (2013.01)

(58) Field of Classification Search
  CPC ......... G01B 7/30; G01D 5/145; G01R 33/072
  USPC .................................................. 324/207.25
  See application file for complete search history.

(56) References Cited

U.S. PATENT DOCUMENTS

| 5,742,160 | A * | 4/1998 | Bergstedt | G01P 3/487 324/162 |
| 8,324,891 | B2 | 12/2012 | Kejik et al. | |
| 8,358,125 | B2 | 1/2013 | Moser et al. | |
| 8,508,218 | B2 | 8/2013 | Reymond et al. | |
| 8,963,540 | B2 | 2/2015 | Reymond et al. | |
| 2010/0045275 | A1* | 2/2010 | Frachon | G01D 5/145 324/207.24 |
| 2011/0175600 | A1* | 7/2011 | Jerance | G01D 5/145 324/207.25 |
| 2012/0286773 | A1* | 11/2012 | Reymond | G01R 33/077 324/207.2 |
| 2013/0179117 | A1* | 7/2013 | Delbaere | G01D 5/145 702/150 |
| 2016/0334242 | A1* | 11/2016 | Ausserlechner | G01D 5/145 |
| 2017/0199056 | A1* | 7/2017 | Granig | G01D 5/165 |

OTHER PUBLICATIONS

U.S. Appl. No. 12/601,818, filed May 28, 2008, Ecole Polytechnique Federale de Lausanne.
U.S. Appl. No. 13/806,638, filed Jul. 1, 2011, Lem Intellectual Property SA.
U.S. Appl. No. 14/902,654, filed Jul. 10, 2014, MPS Tech Switzerland.

\* cited by examiner

*Primary Examiner* — Jay Patidar

(74) *Attorney, Agent, or Firm* — Perkins Coie LLP

(57) ABSTRACT

A magnetic angular sensing system has a magnet magnetized radially and a magnetic angular sensor for sensing the angular position of the magnet. The magnetic angular sensor is mounted in parallel to the axis of the magnet and is non-coplanar with the magnet. The magnetic angular sensor senses an angular position of the magnet based on a detected axial magnetic field component and a tangential magnetic field component of the magnetic field vector where the sensor mounted. This invention provides a flexible sensing system.

15 Claims, 10 Drawing Sheets

MAGNETIC ANGULAR SENSING SYSTEM WITH SIDE-SHAFT MOUNTED SENSOR AND THE METHOD THEREOF

CROSS-REFERENCE TO RELATED APPLICATIONS

This application claims priority to and the benefit of European Patent Application No. 15185514.5, filed Sep. 16, 2015, which is incorporated herein by reference in its entirety.

TECHNICAL FIELD

The present invention generally relates to sensor, and more particularly but not exclusively relates to magnetic angular sensing system with side-shaft mounted sensor (i.e. the sensor is mounted/placed at the side of the shaft of a magnet).

BACKGROUND OF THE INVENTION

Angular position of a magnet which is magnetized radially such as a cylinder magnet or a ring magnet, is sought to be detected in many applications, for example in vehicle drive system. FIG. 1 illustrates a prior art cylinder magnet 10 which is magnetized radially along the diameter. A magnetic sensor 11 placed at the right bottom of the center of the magnet 10, and the magnetic sensor 11 is used to detect the angle orientation of the magnetic field component B generated by the cylinder magnet 10. In this sensing configuration, the magnetic field component B from a north pole N to a south pole S of the magnet 10 is in an opposite direction (180 degree rotated) to a magnetizing direction M. Thus by detecting the angle orientation of the magnetic field vector B rightly below the magnet 10, the angular position in relating to the magnetizing direction M of the magnet 10 can also be determined.

In some applications, referring to FIG. 2, a magnet magnetized radially such as a cylinder magnet 10 is fixed to a spindle 20 along z axis which is perpendicular to the plane xy of the magnetic. In such situations, a magnetic sensor cannot be placed at the right bottom of the center of the magnet 10 to sense the magnetizing direction M. In such situation, a magnetic angular sensor 21 may be placed at the xy plane along the radius r of the magnet 10. And the radius magnetic field component Br is reflective of the angular position α towards the magnetizing direction M. The angular position α versus the value of the radius magnetic field component Br has a relationship as shown in FIG. 5A. And in some other applications, for example as shown in FIG. 3, a magnet 10 may be fixed on a board 30 or embedded in a device and also with a rotatable spindle 20, and a magnetic sensor is not able to be placed either at right bottom of the center of the magnet 10, nor at the plane xy of the magnetic. Accordingly a sensing system is required to detect the angular position towards the magnetizing direction M during these situations where the magnetic angular sensor is neither placed at right bottom of the center of the magnet, nor at the plane of the magnet. And thus a more flexible sensing system with magnetic angular sensor placed side-shafted at either zone A1, A2, A3 or A4 that can be adapted to various situations is required.

SUMMARY OF THE INVENTION

It is one of the objects of the present invention to provide a magnetic angular sensing system and corresponding sensing method for a more flexible, easy mounting sensing system.

In accomplishing the above and other objects, there has been provided, in accordance with an embodiment of the present invention, a magnet magnetized radially on a plane of the magnet, the magnet having a magnetizing direction from a north pole to a south pole of the magnet, and wherein the north pole and the south pole are located respectively at two opposite ends of the plane, wherein the magnet is rotatable around an axis perpendicular to the plane; and a magnetic angular sensor having a sensing plane in parallel to the axis and perpendicular to a radius between the axis and the magnetic angular sensor that is non-coplanar with the plane of the magnet, and wherein the magnetic angular sensor is configured to sense an axial magnetic field component of a magnetic field vector generated by the magnet at a first detection direction of the sensing plane in parallel to the axis and to sense a tangential magnetic field component of the magnetic field vector at a second detection direction of the sensing plane orthogonal to the radius and the axis, the magnetic angular sensor is configured to provide an angle signal indicative of the angular position of the magnet, and wherein the angle signal is generated according to the axial magnetic field component and the tangential magnetic field component.

In addition, there has been provided, in accordance with another embodiment of the present invention, a method detecting an angular position of a magnet magnetized radially, the method comprising: placing a magnetic angular sensor side-shafted to the magnet which is below the plane of the magnet and is in parallel to a rotatable axis of the magnet; detecting an axial magnetic field component and a tangential magnetic field component of a magnet field vector where the sensor is placed; detecting an angle orientation of the magnetic field vector projected in a sensing plane of the sensor, wherein the sensing plane is at the plane of the tangential magnetic field component and the axial magnetic field component; and determining the angular position of the magnet indicative of the differential angle between the magnetizing direction of the magnet and the sensor by matching from the angle orientation of the magnetic field vector.

Furthermore, there has been provided, in accordance with another embodiment of the present invention, a magnetic angular sensor used in a sensing system, wherein the sensing system comprises a magnet magnetized radially on a plane of the magnet, and rotatable around an axis perpendicular to the plane, the magnetic angular sensor having a sensing plane in parallel to the axis and perpendicular to a radius between the axis and the magnetic angular sensor non-coplanar with the plane, the magnetic angular sensor comprising: a first hall effect device configured to sense an axial magnetic field component of a magnetic field vector generated by the magnet at a first detection direction of the sensing plane in parallel to the axis; a second hall effect device configured to sense a tangential magnetic field component of the magnetic field vector at a second detection direction of the sensing plane orthogonal to the radius and the axis; and a processing unit configured to provide an angle signal indicative of an angular position of the magnet based on the axial magnetic field component and the tangential magnetic field component.

BRIEF DESCRIPTION OF THE DRAWINGS

Non-limiting and non-exhaustive embodiments are described with reference to the following drawings. The drawings are only for illustration purpose. Usually, the drawings only show part of the system or circuit of the embodiments.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The phrase "couple" in the description may refer to direct connection or indirect connection via interim media. The interim media may include conductor which may has resistance, parasitic capacitance and/or parasitic inductance. The interim media may include diode or other component/circuit. The phrase "circuit" in the description may have forms of Integrated Circuit (IC), device, printed circuit board system or others.

Figure 1:
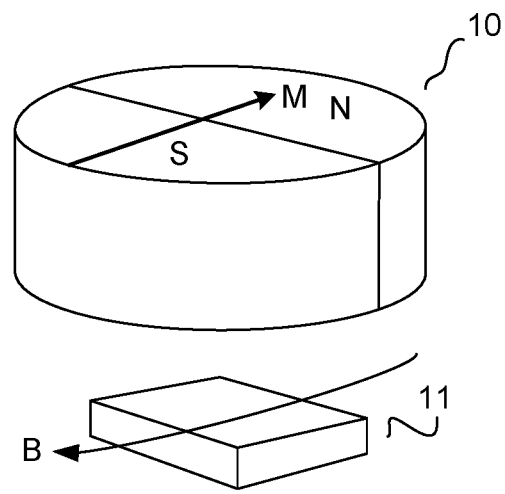
FIG. 1 illustrates a prior art cylinder magnet which is magnetized radially along the diameter.
Figure 2:
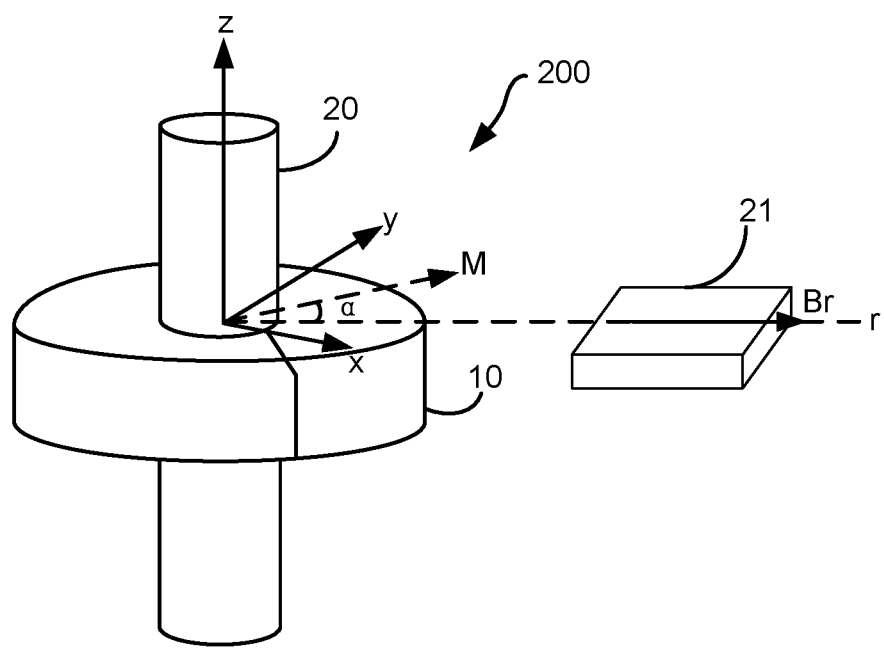
FIG. 2 illustrates a possible magnet fixed to a spindle in the prior art.
Figure 3:
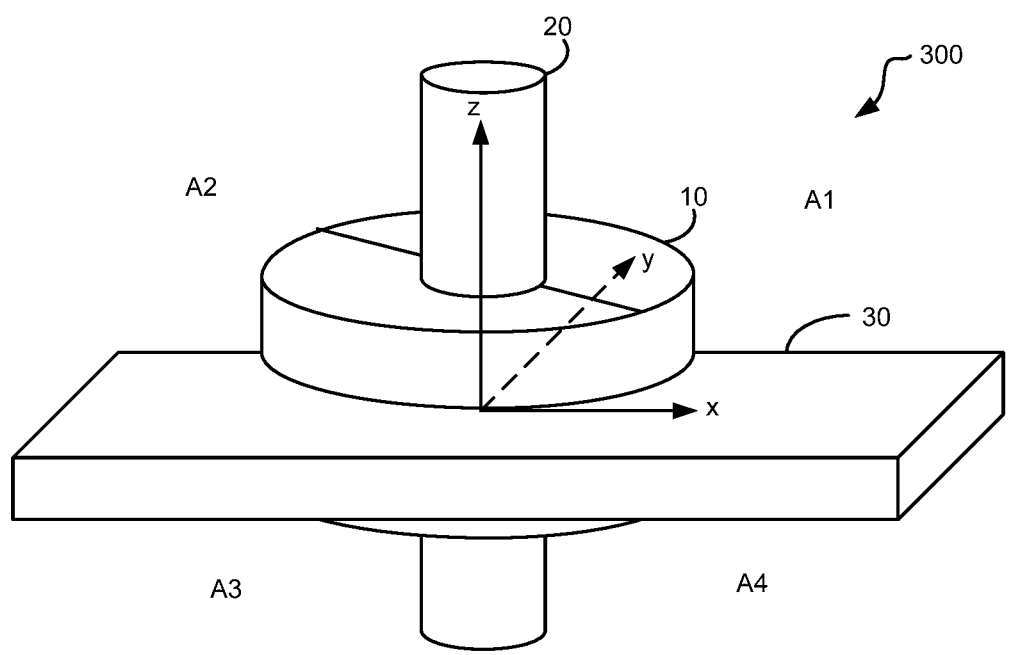
FIG. 3 illustrates a magnet fixed on a board and a spindle in the prior art.
Figure 4:
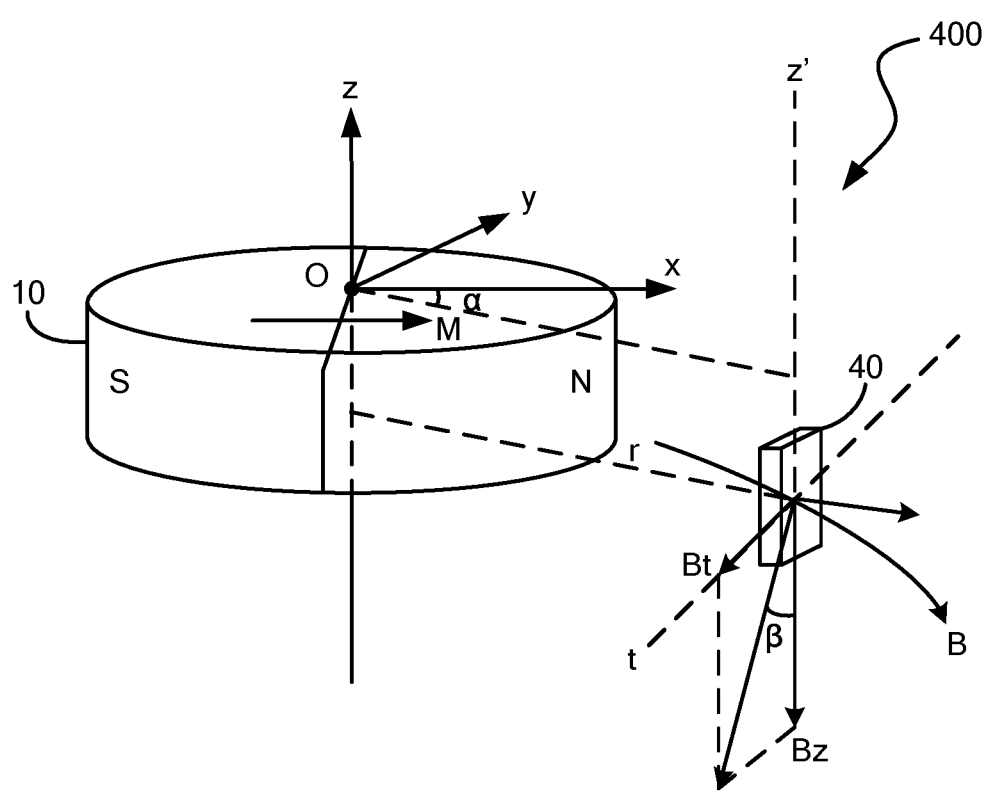
FIG. 4 illustrates a magnetic sensing system comprising a magnet and a magnetic angular sensor mounted side-shaft according to an embodiment of the present invention.

FIG. 4 illustrates a magnetic sensing system 400 comprising a magnet 10 and a magnetic angular sensor 400 according to an embodiment of the present invention. The magnetic angular sensor 40 is placed at the side of the shaft of magnet 10 (i.e. side-shafted to magnet 10), and the magnetic angular sensor 40 is placed in either zone of A1, A2, A3 or A4 as desired. Magnet 10 is magnetized radially and has a magnetizing direction M from a south pole S to a north pole N of magnet 10. In this embodiment, the magnetic angular sensor 40 is placed neither at right bottom of the center of the magnet 10 at the axis z, nor at the plane xy of the magnet 10. Instead, the magnetic angular sensor 40 is placed in parallel to the axis z below the plane of the magnet 10 but to the side of the magnet 10, and non-coplanar with the plane xy of the magnet 10, and is used to detect the magnetic field vector B in two directions. The first direction is in its tangential direction t for obtaining its tangential magnetic field component Bt of the magnetic field vector B, and the second direction is parallel to the axis z for obtaining its axial magnetic field component Bz. As well known to a person of ordinary skill in the art, the tangential direction t is perpendicular to the plane determined by both the axis z and the corresponding radius r between axis z and sensor 40. Or in other words, sensor 40 detects the tangential magnetic field component Bt and the axial magnetic field component Bz of the magnetic field vector B projected in a sensing plane tz', where the sensing plane tz' is in parallel to the axis z and perpendicular to radius r between the axis z and the sensor 40. The magnetic angular sensor 40 provides an angle signal DA indicative of the angular position α of the magnet 10 which shows the differential angle between the magnetizing direction M of the magnet 10 and the corresponding radius r where the sensor 40 is mounted. The embodiment of the invention provides a flexible sensing system.

Figure 5A:
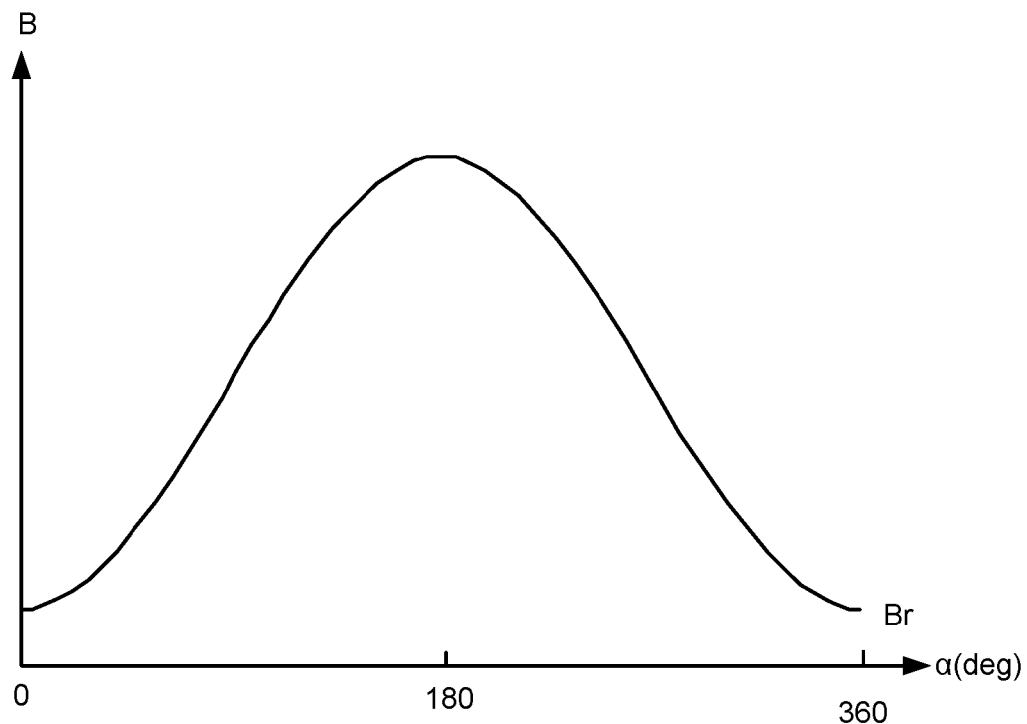
FIG. 5A illustrates a waveform diagram to illustrate the radius magnetic field component versus the angular position α towards the magnetizing direction M of FIG. 2.
Figure 5B:
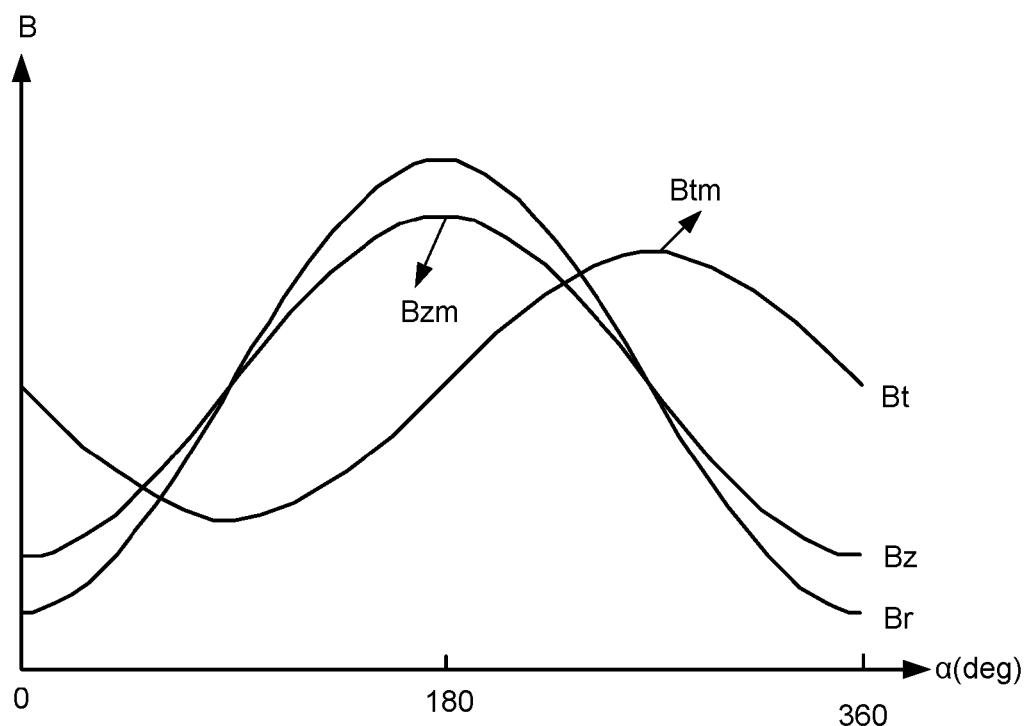
FIG. 5B illustrates a waveform diagram to illustrate the tangential magnetic field component, the axial magnetic field component, and the radius magnetic field component, according to an embodiment of the present invention.

FIG. 5B illustrates a waveform diagram to illustrate the tangential magnetic field component Bt in tangential direction t, the axial magnetic field component Bz in axial direction z' which is parallel to the axis z of a magnet, and the radius magnetic field component Br in radius direction r, according to an embodiment of the present invention. As shown, the tangential magnetic field component Bt is proportional to the radius magnetic field component Br.

Since the tangential magnetic field component Bt and the axial magnetic field component Bz have the predetermined phase difference along the angular position α, when a magnetic angular sensor is placed side-shafted, the angular position α in plane xy in view of the magnetizing direction M can be matched by the angle orientation β of magnetic field vector B in plane tz' by detecting both the tangential magnetic field component Bt and the axial magnetic field component Bz. Where the angular orientation β can be determined by the tangent of Bt/Bz, where β=Arctan(Bt/Bz), and various methods and circuits may be used to implement this function to determine the angular orientation β based on the tangential magnetic field component Bt and the axial magnetic field component Bz. The angular position α would have a predetermined value corresponding to the angle orientation β according to the illustration shown in FIG. 5B. In one embodiment, by properly setting the sensitivity ratios of the tangential magnetic field component Bt and the axial magnetic field component Bz, the angular position α is proportional to the angular position β.

FIGS. 6-15 illustrate a plurality of embodiments which are applicable to detect the angle orientation β or to detect the oriented angular position α.

Figure 6:
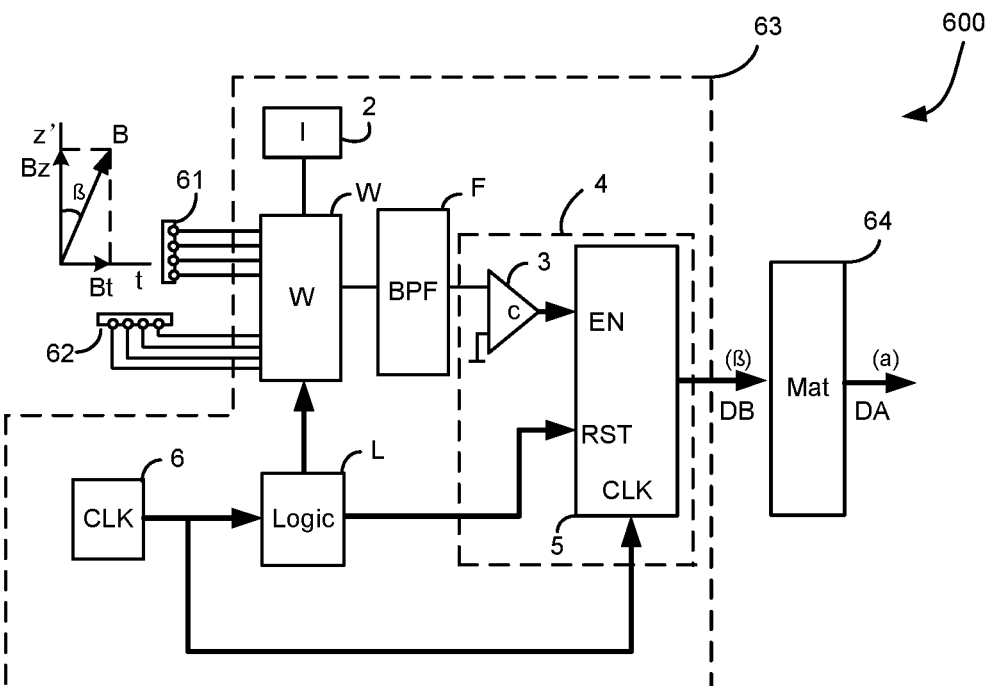
FIG. 6 illustrates a schematic block diagram of a magnetic angular sensor which is placed side-shafted with a first processing unit and a second processing unit according to an embodiment of the present invention.

FIG. 6 illustrates a schematic block-diagrammatical illustration of a magnetic angular sensor 600 which is placed side-shafted as shown in FIG. 4 to detect the angular position of a magnet 10 based on the tangential magnetic field component Bt and the axial magnetic field component Bz according to an embodiment of the present invention. Magnetic angular sensor 600 detects the angular orientation β of a projection of a magnetic field vector into a sensing plane tz', and provides the angular position α of the magnetic angular sensor 600 in relating to the magnetizing direction M (shown in FIG. 4) by matching with the angular orientation β.

Figure 10:
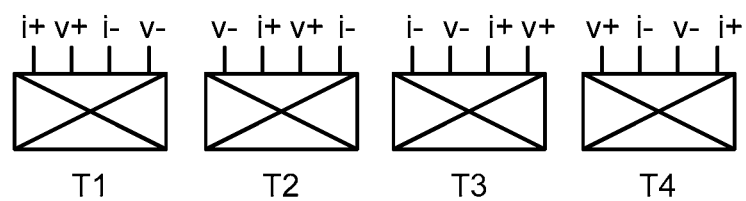
FIG. 10 illustrates four non-reverse wiring schemes T1, T2, T3 and T4 of a hall effect device (symbolized as a crossed box) according to an embodiment of the present invention.

Magnetic angular sensor 600 comprises two hall effect devices 61, and 62. The devices 61 and 62 are vertical hall effect devices, with their respective detection directions lying in the sensing plane, running along the t-axis and along the z'-axis respectively. The devices 61 and 62 each have two pairs of connectors (as shown in FIG. 10), and for sensing an angle orientation, a bias current is applied to each device via the one pair of connectors (e.g. the pair shown as i+ and i− in FIG. 10), and the resulting hall voltage is detected via the other pair of connectors (e.g. the pair shown as v+ and v− in FIG. 10). The devices 61 and 62 are operationally connected to a wiring unit W which is controlled by a control unit L. Wiring unit W applies wiring schemes to the devices 61 and 62 which determine which of the pairs of connectors is used for applying the bias current, and which for picking up the hall voltage. Accordingly, the sensor 600 comprises a current source 2 operationally connected to wiring unit W.

Besides connecting to the connectors of the hall effect sensors 61, 62 and an output of current source 2, wiring unit W is furthermore operationally connected to an input of filtering unit F. In one embodiment, filtering unit F is a band pass filter (BPF), so as to filter the hall voltage signals obtained via wiring unit W from the hall effect devices 61 and 62.

The filtered signals outputted by filtering unit F are fed into one input of a comparator 3; the other input of comparator 3 being connected to ground potential. The signal outputted by the comparator 3 is a digital signal, and the phase thereof can be detected in a way known in the art. It is noted that the digital signals are drawn as bold arrows, and analogue signals are drawn as thin lines. For detecting the phase, e.g., a phase detection unit 5 as depicted in FIG. 6 can be used. Phase detection unit 5 receives the signal outputted by the comparator 3 (which is a Pulse Width Modulation signal), a signal outputted by control unit L (usually a square signal) and a clock signal outputted by clock 6. Comparator 3 and phase detection unit 5 are constituents of an output unit 4 of the sensor 600. A signal DB indicative of the sought angle orientation β is outputted at the output of output unit 4.

In the shown embodiment, current source 2, wiring unit W, filtering unit F, clock 6, control unit L and output unit 4 are constituents of a first processing unit 63 which provides the first angle signal DB indicative of the angle orientation β of the magnetic field vector B in the sensing plane tz' (see FIG. 4). In one embodiment, the angle signal DB is an eight-bit digital signal. And sensor 600 further comprises a second processing unit 64 configured to provide an angle signal DA indicative of the angular position α of the magnetic angular sensor 600 in relating to the magnetizing direction M in FIG. 4, or in other words, the differential angle α from the radius r where the sensor 600 placed to the magnetizing direction M. In one embodiment, angle signal DA is obtained by adding a predetermined value to the first angle signal DB indicative of the angle orientation β of the magnetic field vector B.

Figure 7:
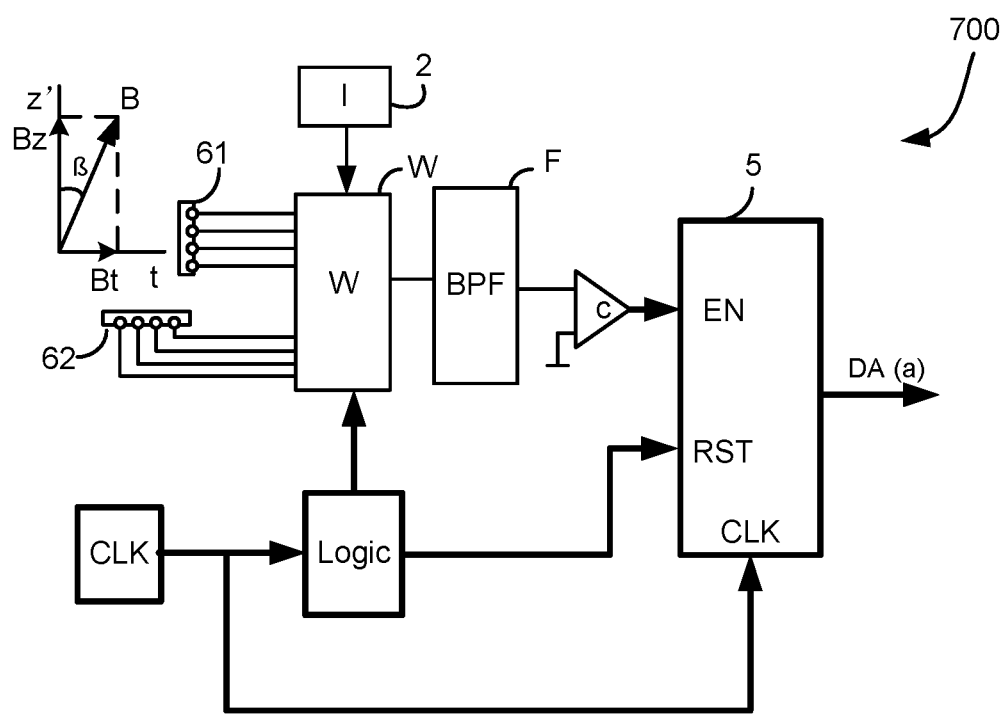
FIG. 7 illustrates another embodiment of a magnetic angular sensor where an angle signal is outputted directly without a second processing unit.

FIG. 7 illustrates another embodiment where an angle signal DA is outputted directly by the output unit 5 without a second processing unit for deciding the angular position of the magnetic angular sensor 40 in relating to the magnetizing direction M in FIG. 4, according to an embodiment of the present invention. In one embodiment, by appropriately setting the sensitivity ratios of the first hall effect device 61 and the second hall effect device 62, for example, by setting the sensitivity ratios of the first hall effect device 61 and the second hall effect device 62 as 1:1, an angle signal DA indicative of the angular position α of the magnetic angular sensor 40 in relating to the magnetizing direction M of a magnet 10 (see FIG. 4) can be directly outputted at the output of the output unit 5.

Figure 8:
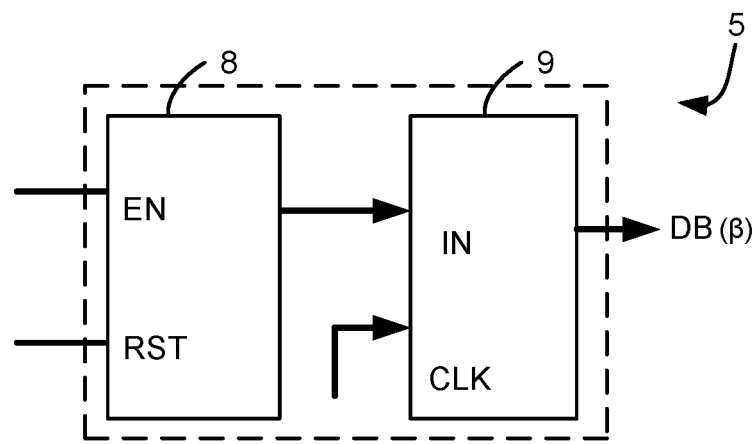
FIG. 8 illustrates a block diagram of a phase detection unit according to an embodiment of the present invention.

FIG. 8 illustrates a block diagram of a phase detection unit 5 as it could be used in the embodiment of FIG. 6, according to an embodiment of the present invention. Phase detection unit 5 comprises a set-reset latch 8 and a counter 9. A set input EN of the latch 8 is coupled to the output of the comparator 3 so as to trigger an on-state (or high state), and a reset input RST of latch 8 is coupled to an output of the control unit L so as to trigger an off-state (or idle state), or vice versa. Both inputted logic signals have the same frequency, but their relative phase depends on (and may even represent) the sought angle orientation β. As a result, a PWM signal having a duty cycle representative of the relative phase of the two inputted logic signals and thus representative of the angle orientation β is outputted by latch 8. The PWM signal outputted by latch 8 is fed into counter 9 which in addition is provided with the clock signal outputted from a clock circuit 6 (see FIG. 6), where the clock signal has a much higher frequency, e.g. three or four orders of magnitude higher than the PWM signal outputted by latch 8, depending on the desired resolution. Counter 9 outputs an eight-bit signal DB representative of the sought angle orientation β. Or in another embodiment, by properly setting the sensitivity ratios of the hall effect devices, counter 9 outputs a digital signal representative of the sought angle position α directly. As mentioned before, other phase detection principles and implementations and in general, other output units may be used.

Figure 9:
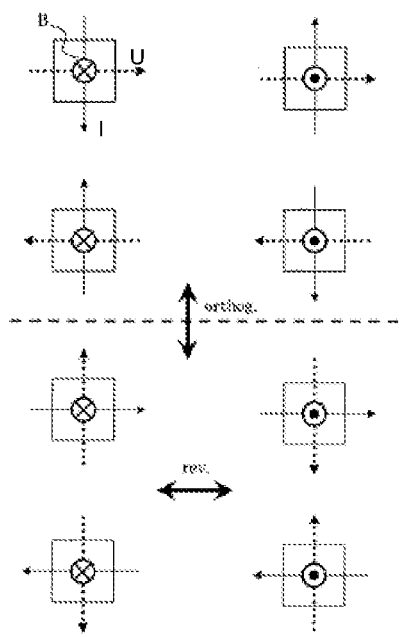
FIG. 9 illustrates a symbolic diagram of all possible schemes of a hall effect device according to an embodiment of the present invention.

FIG. 9 illustrates a symbolic diagram of various possible schemes of a hall effect device according to an embodiment of the present invention. Eight wiring schemes applicable to a hall effect device are illustrated. In FIG. 9, a hall effect device is symbolized by a square, the direction of flow of a bias current I is symbolized by a thin arrow, and the direction of a hall voltage signal VHall is symbolized by a dotted arrow. These "directions" correspond to a way of wiring the hall effect device, i.e. of making connections to the connectors of the hall effect device. The detection direction of the hall effect device is perpendicular to the drawing plane, and the symbol in the middle of a hall effect device indicates whether two wiring schemes result in a hall voltage of the same or of opposite sign. Those wiring schemes on the left hand side in FIG. 9 all result in the same sign of VHall, and accordingly, these wiring schemes are not reverse wiring schemes. Two wiring schemes are referred to as reverse if the hall voltage signal in one wiring scheme is in a different sign to the hall voltage signal in the other wiring scheme. The same applies to the wiring schemes on the right hand side of FIG. 9. But any wiring scheme on the left is a reverse wiring scheme of any wiring scheme on the right in FIG. 9. Furthermore, any wiring scheme in the top half of FIG. 9 is orthogonal to any wiring scheme in the bottom half of FIG. 9, since the pair of connectors at which the bias current I is applied to a hall effect device in the top half of FIG. 9 is used for outputting VHall at a hall effect device in the bottom half of FIG. 9 and vice versa.

FIG. 10 illustrates four non-reverse wiring schemes T1, T2, T3 and T4 of a hall effect device (symbolized as a crossed box) according to an embodiment of the present invention. The letters i and v indicate connectors connected for bias current application and hall voltage detection, respectively, and the "+" and "−" indicate the polarization (or "direction", cf. above). The corresponding reverse wiring schemes can be obtained by crossing the output connectors of the hall effect device, i.e. by replacing v+ by v− and v− by v+; these (reverse) wiring schemes will be indicated by adding a minus, i.e. by −T1, −T2, −T3, −T4.

Figure 11:
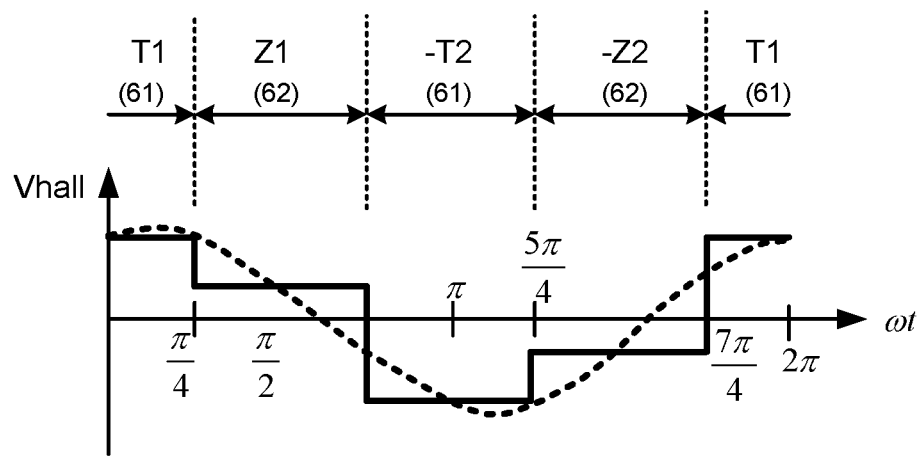
FIG. 11 illustrates a waveform diagram showing the hall voltage signals along the time axis when applying bias currents to the hall effect devices, according to an embodiment of the present invention.

For ease of understanding the function of the sensor 600 in FIG. 6, FIG. 11 illustrates a waveform diagram showing the hall voltages VHall along the time axis ωt when applying bias currents to the hall effect devices 61 and 62 of FIG. 6, according to an embodiment of the present invention. A wiring scheme applied to device 61 will be referred to with the letter T (T1, T2, T3, T4) as indicated in FIG. 10, whereas the same wiring scheme applied to device 62 is referred to with the letter Z (Z1, Z2, Z3, Z4). The bias current applied to a hall effect device is kept constant while feeding the corresponding hall voltage signal to filtering unit F, and accordingly, the bias current is applied to the hall effect devices in form of current pulses, i.e. in rectangular form with pulses of constant current. Wiring unit W firstly applies wiring scheme T1, then Z1, then −T2 and then −Z2. Thereafter, the same sequence of wiring schemes will be repeated again and again. In other words, a constant current I drawn from current source 2 will be alternately applied to devices 61 and 62, and simultaneously, the respective device to which the bias current I is applied is connected with its other pair of connectors to filtering unit F. The hall voltages entering filtering unit F describe a step function (drawn in solid lines in FIG. 11). The filtered signals outputted by filtering unit F are drawn as a dotted line in FIG. 11.

Filtering unit F has a fundamental frequency f corresponding to a period Tf=1/f, wherein Tf corresponds to 2π in FIG. 11. Each of the wiring schemes is applied for Tf/4 before changing the wiring to the next wiring scheme. Clock 6, together with control unit L, is operated accordingly. The applied wiring schemes are chosen in such a way that in a first half-period of Tf/2, the devices 61 and 62 generate a hall voltage of the same sign, and in a subsequently following second half-period of Tf/2, orthogonal reverse wiring schemes will be applied, wherein the sequence of hall devices to which the wiring schemes are applied is the same in the first and the second half-period. This results in a filtered signal having the fundamental frequency f=1/Tf and being substantially sine-shaped, wherein the phase of the filtered signal is indicative of the angle orientation β describing the angle orientation of the projection of the magnetic field vector B to be detected. It is furthermore remarkable that an offset usually present in a hall effect device will be cancelled this way.

Comparing the filtered signal with ground potential in comparator 3 results in a digital signal (more particularly in a square signal), and by means of this digital signal and the clock signal outputted by clock 6 and the logic signal (typically a square signal) outputted by control unit L, phase detection unit 5 (FIG. 8) can output a digital signal indicative of the angle orientation β of the projection of the magnetic field vector B to be detected, and by properly setting the sensing ratios of the hall effect devices, phase detection unit 5 can output a digital signal indicative of the sought angle position α.

In one embodiment, the three signals outputted respectively by comparator 3, control unit L, and latch 8 have the same frequency, namely the before-mentioned frequency f. Of course, other ways of evaluating the filtered signal are thinkable, in particular dispensing with comparator 3 and/or with latch 8 and/or counter 9. But such ways will usually be more complicated and/or slower. When the connections to the current source 2 are established simultaneously with the connections to the filtering unit F, current spikes and corresponding hall voltage spikes may occur (not shown in FIG. 11), in particular when initiating the connections, but also when breaking the connections. Such spikes in the voltage signals fed to filtering unit F result in inaccuracies of the detected angle orientation β. In order to avoid such problems, it is possible to establish the connections of the devices 61 and 62 to the current source 2 already before the connections to the filtering unit F are made and/or to disconnect the current source 2 from the respective hall effect device after the connections of that hall effect device to the filtering unit F are broken. Accordingly, there are times when twice the bias current I is drawn. This of course requires that current source 2 can simultaneously provide twice the bias current I, or that a second current source is provided.

Figure 12:
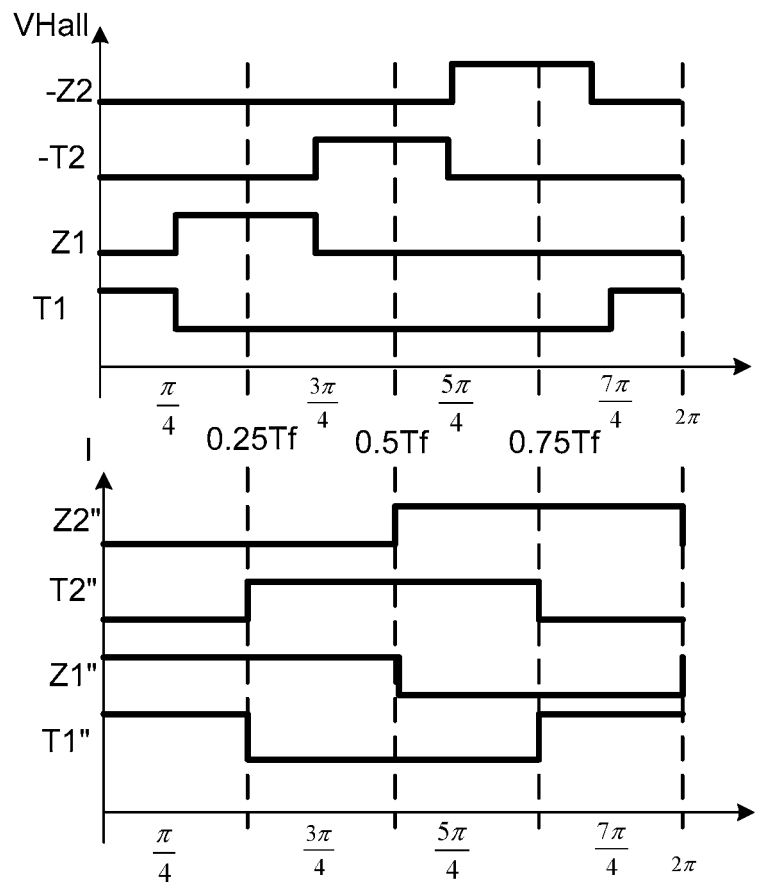
FIG. 12 illustrates the bias currents and resulting hall voltage signals suitable for suppressing spikes, according to an embodiment of the present invention.

FIG. 12 illustrates the applied bias currents I and resulting hall voltages VHall suitable for accomplishing the above-described procedure for suppressing spikes and thus improving measuring accuracy, according to an embodiment of the present invention. The time development of I and VHall is shown. In the lower part of FIG. 12 where the applied currents I are shown, the indicated wiring schemes for 61 and 62 are put in quotes (e.g. Z2", T2", Z1" and T1") because the full wiring scheme (comprising the connections of both pairs of connectors) is of course only present during that portion of time during which also the other pair of connectors is properly connected, namely during the other pair of connectors is connected to the filtering unit F. Particularly as shown in FIG. 12: for 62 the connections to filtering unit F according to wiring scheme Z1 are present from π/4 to 3π/4 (upper portion of FIG. 12) only, but the connections to current source 2 according to wiring scheme Z1 are present from 0 to π/2 (lower portion of FIG. 12). In this case, the connections for applying the bias current I are established and broken a duration of Tf/8 (corresponding to π/4) earlier and later, respectively than the connections to filtering unit F; they are present twice as long as the connections to filtering unit F are present and centered about the time the connections to filtering unit F are present.

Another improvement which allows to achieve an excellent offset cancellation even in case of strongly non-linear hall effect devices makes use of not only two wiring schemes (in each hall effect device), but of four.

The repeating wiring sequence in this case has a length of not Tf, but of 2Tf. During the first period of length Tf, the same sequence as illustrated in FIG. 12 can be used, i.e. T1, Z1, −T2, −Z2. But in the second period of length Tf, the sequence T3, Z3, −T4, −Z4 is applied (FIG. 10). The filtered signal is then an average between the first and the second period of length Tf. Of course, this embodiment can be also combined with the embodiment illustrated in FIG. 12.

Figure 13:
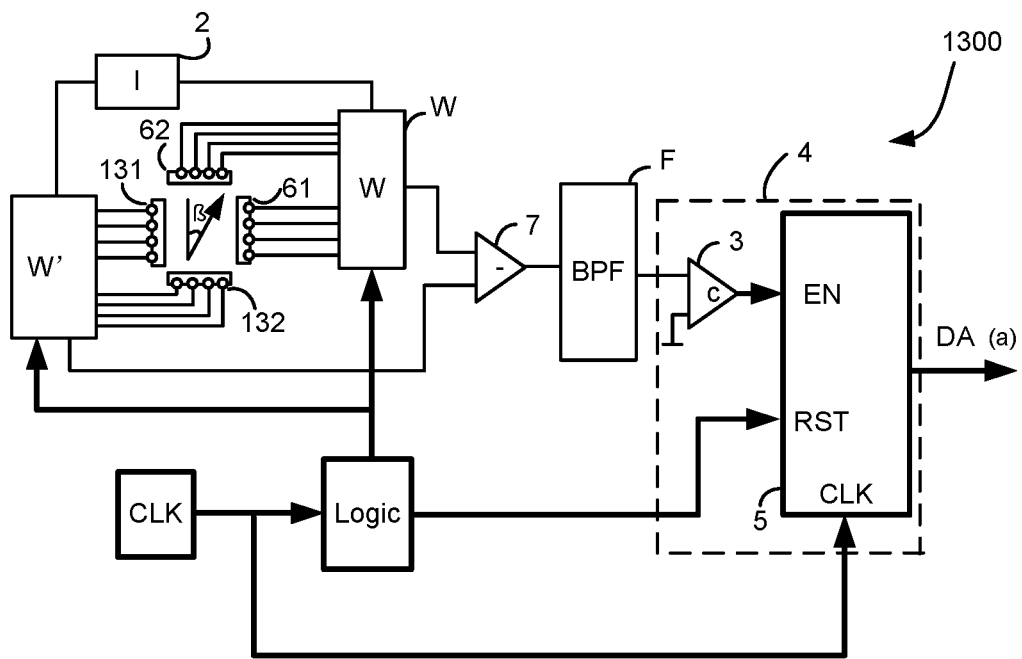
FIG. 13 illustrates a schematic block diagram of yet another magnetic angular sensor according to an embodiment of the present invention.

FIG. 13 illustrates a schematic block diagram of yet another improved sensor 40 according to an embodiment of the present invention. In this case, an additional second set of hall effect device is provided: it comprises a third hall effect device 131 and a fourth hall effect device 132 placed in parallel to the devices 61 and 62 respectively. These devices 131 and 132 are preferably constructed identical to the respective devices 61 and 62, and they are aligned the same way as 61 and 62, but rotated about an axis perpendicular to the sensing plane by 180° with respect to the corresponding other device. The additional devices 131 and 132 are controlled by an additional second wiring unit W' which is similar to wiring unit W; both wiring units W and W' are controlled by control unit L. Otherwise, the properties of the embodiment of FIG. 13 can be inferred from the properties of the embodiment of FIGS. 6 (and 7). To 131 and 61, the same wiring schemes are simultaneously applied, and to 132 and 62, the same wiring schemes are also simultaneously applied. The wiring schemes may be those discussed in conjunction with FIG. 11 (T1, Z1, −T2, −Z2) or those of the improved embodiment mentioned above (T1, Z1, −T2, −Z2, T3, Z3, −T4, −Z4), wherein the spike-suppression idea (FIG. 13) may of course be applied here too.

Before the VHall signals of the hall effect devices are fed to filtering unit F, a difference between a first hall voltage signal from the first set of devices (61, 62) and a second hall effect signal from the second set of devices (131, 132) is formed using a subtraction unit 7, e.g., embodied as the combination of an adder and an inverter, and that difference signal is then fed to filtering unit F. Due to the rotated alignment of the second two devices 131 and 132, the absolute value of that difference signal will be approximately twice the absolute value derived from each of the sets of the devices, and thus, not only the signal-to-noise ratio will be improved, but much more importantly, switching noise occurring when establishing or breaking the connection to filtering unit F (by changing wiring schemes) will be at least to a great extent canceled. Accordingly, an even more accurate output signal can be obtained, but at the cost of having to provide twice the bias current as compared to using only half the number of hall effect devices.

In another special embodiment which is particularly suitable when the projection of the magnetic field vector B is rotating, the filtering unit substantially is a band pass filter, in particular one having a quality factor Q of preferably about $\pi/2$.

In a situation where the magnetic field vector B (and also the projection) is rotating, like in the typical case of a permanent magnet attached to a rotating shaft, the available data (outputted by output unit 4) is always delayed with respect to the (current) shaft position, because the sensor's output is related to the average position of the shaft during the measurement cycle, and not to the position at the end of the measurement cycle. This lag behind becomes important when the measurement time is not short with respect to the magnet revolution period, or when the data is subsequently averaged (for instance for decreasing noise). One solution would be to correct the outputted data by evaluating the rotation speed, e.g., by taking the former position and add or subtract the shaft displacement during half an output period. This, however, requires some logic processing which costs measurement time and requires a relatively complex implementation. The proposed solution, however, is to make use of the natural phase shift generated by a band pass filter when the frequency moves away from the center frequency. And exactly this takes place when the field is rotating. The frequency of the signal at the band pass filter input decreases when the magnetic field projection rotates in the same direction as described by the wiring sequence (in the example of FIG. 6: t, z', −t, −z', the letters indicating the hall effect devices 61 and 62, and the sign indicates reversed wiring schemes), and it increases when the magnet rotates in the opposite direction as described by the wiring sequence. As a consequence, the filter introduces a positive phase shift when the magnet rotates against the wiring sequence and a negative phase shift when the magnet rotates in the same sense as the wiring sequences. Thus, one can design the band pass filter in an adequate way, to detect the rotating direction of the magnetic field projection and set the measurement direction (more precisely, the sequence of wiring schemes) accordingly such that the phase shift at least substantially cancels the lag described above (t, z', −t, −z' or: −z', −t, z', t). The quality factor Q of substantially $\pi/2$ allows to practically perfectly compensate for the described lag.

It is also possible to use three or more (and six or more) hall effect devices and apply the same ideas as addressed above. But in this case, it is advisable to carefully select the order (sequence) in which hall voltages are fed from the respective hall effect device to the filtering unit. And, in addition, e.g., if the angle orientation of the hall effect devices is not regularly spaced, it is advisable to carefully adjust the time durations during which each respective hall effect device feeds its hall voltage to filtering unit F. The order (sequence) and times shall be chosen such that the staircase signal fed to the filtering unit mimics (as close as possible) a sine signal of frequency $f=1/Tf$. Furthermore, it shall be mentioned that each of the hall effect devices mentioned herein can be a simple hall effect device or can be composed of two or more simple hall effect devices, the latter being wired in a parallel or serial or mixed parallel-and-serial way. In one embodiment, a hall effect device is composed of two simple hall effect devices wired in parallel, and has its two pairs of connectors configured in such a way that each of the two simple hall effect devices are connected in parallel to form the respective pair of connectors. In another embodiment, a composed hall effect device is composed of two simple hall effect devices and for each of the two simple hall effect devices, a separate current supply is provided. Wherein it is also possible to look upon these two separate current supplies as two components of one (composed) current supply. The voltages v− and v+, respectively, of the two simple hall effect devices are fed to separate adders in order to provide the hall voltage of the composed hall effect device. In general, a hall effect device according to the invention may have more than those four contacts which correspond to the before-addressed two pairs of contacts.

All the embodiments mentioned above can very well be realized in a single silicon chip, in particular using CMOS processes. So-called vertical integrated hall effect devices are particularly well suited for such a realization.

Figure 14:
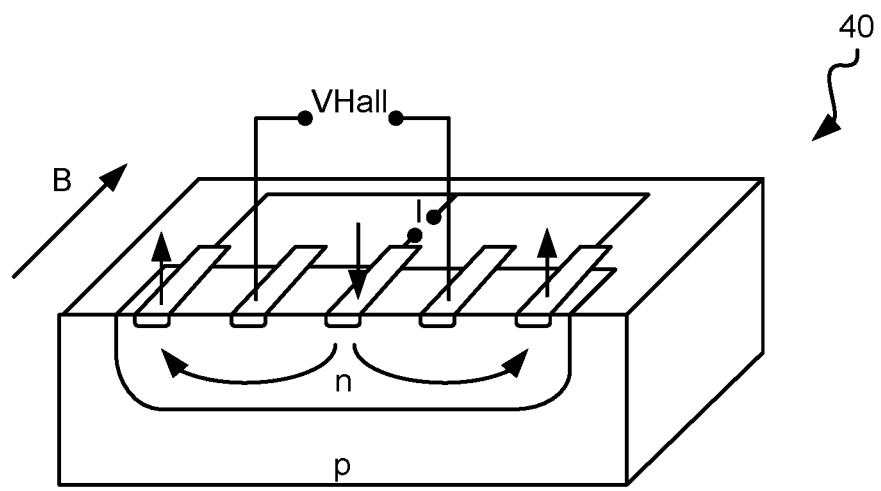
FIG. 14 exemplarily shows a cross-sectional view of a vertical integrated hall effect device according to an embodiment of the present invention.

FIG. 14 exemplarily shows a schematized perspective view of a cross-section through a vertical integrated hall effect device 40 according to an embodiment of the present invention. In a p-doped Silicon substrate, an n-doped well is provided, and five metal contacts embodied as parallel-aligned contact lines are provided on the surface of the Silicon substrate, for applying a bias current I and picking up a hall voltage VHall. Usually, two of the five metal contacts will be shorted, namely the outermost two, as schematically indicated by the bold lines in FIG. 14. The arrow labeled B to the left of the vertical integrated hall effect device 40 illustrates a magnetic field vector of a magnetic field aligned parallel to the detection direction of the vertical integrated hall effect device 40.

According to one exemplary wiring scheme indicated in FIG. 14, the contact in the middle is used for injecting the bias current which then flows, as visualized by the bent arrows, to both outermost contacts, a current source (only symbolically sketched in FIG. 14) being connected between the middlemost and the two outermost contacts. Of course it is also possible to use two separate (simple) current sources, each contacting one of the outermost metal contacts and both contacting the middlemost metal contact. As illustrated in FIG. 14, the other two contacts are used for picking up the resulting hall voltage (which is present if a non-zero magnetic field component exists parallel to the detection direction).

Figure 15:
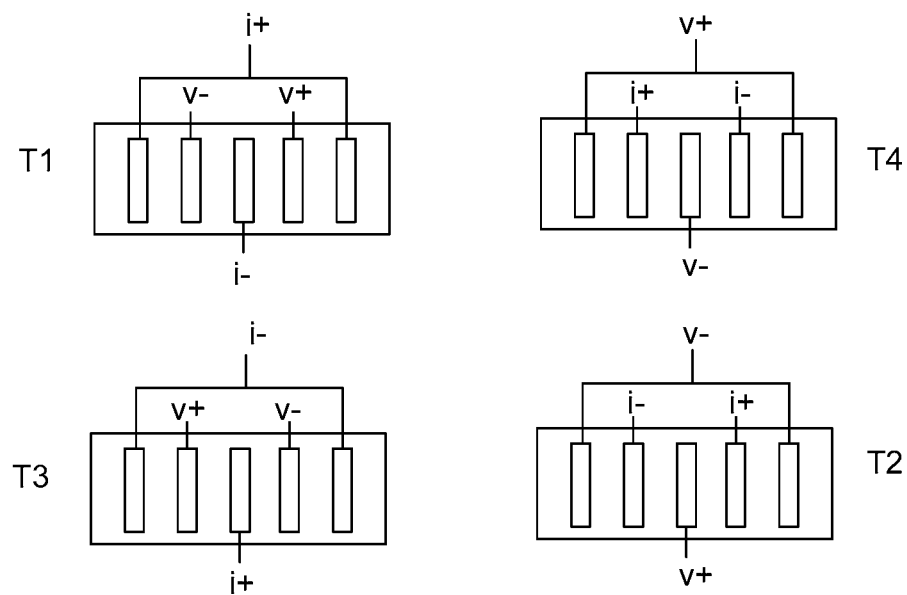
FIG. 15 illustrates a schematic symbolic diagram of four non-reverse wiring schemes applied to a vertical integrated hall effect device according to an embodiment of the present invention.

FIG. 15 is a schematic symbolic illustration of four non-reverse wiring schemes applied to a vertical integrated hall effect device according to an embodiment of the present invention. With reference to the vertical integrated hall effect device 40 of FIG. 14, FIG. 15 can be understood as symbolizing top views onto such vertical integrated hall effect devices 40. The four wiring schemes illustrated in FIG. 15 are named exactly as in FIG. 10, confer there for details.

Aspects of the embodiments have been described in terms of functional units. As is readily understood, these functional units may be realized in virtually any number of components adapted to performing the specified functions. For example, one control unit L and only one wiring unit can be used for realizing an embodiment functioning like the one of FIG. 13, but one could also realize it using two control units and two wiring units W, W'.

Furthermore, the filtering unit F could also be realized as a low-pass filter, and possibly in addition an offset remover (for suppressing DC voltage offsets), at least in the embodiments different from the one described above for compensating for a lag in time using a band pass filter having a suitable quality factor. Generally, the main purpose of the filtering unit is to extract the sine wave of frequency f=1/Tf (having the sought phase) from the hall voltage staircase signal.

Figure 16:
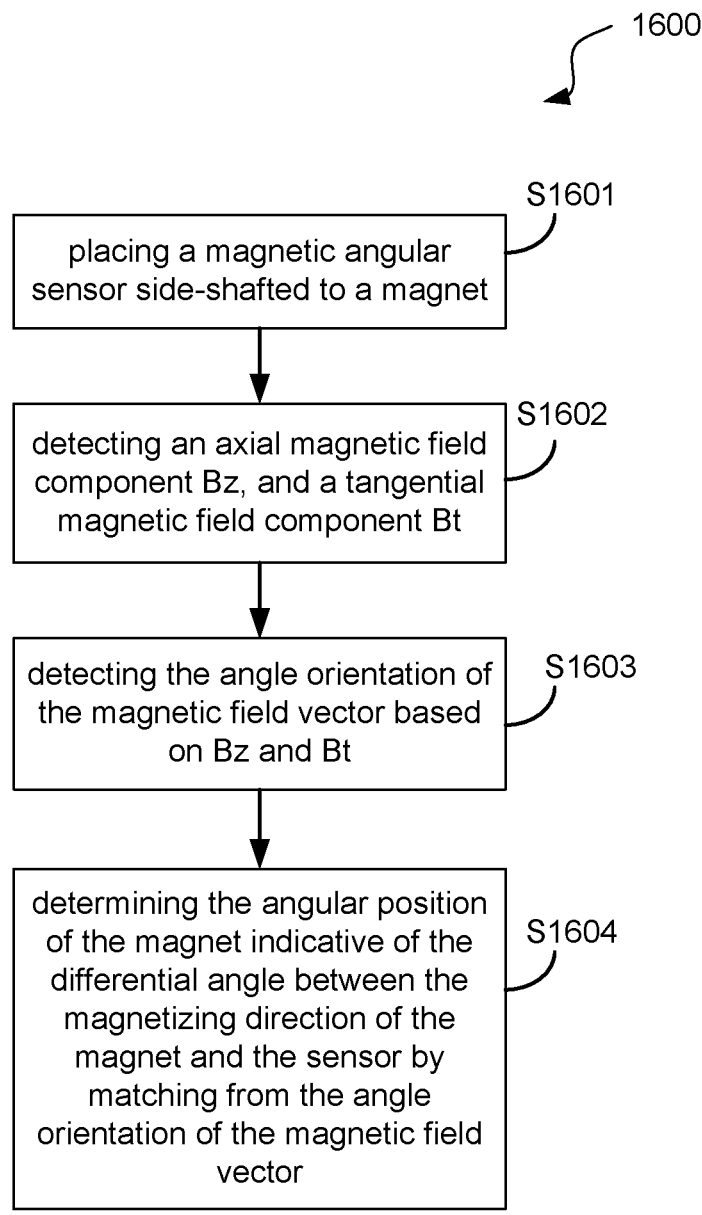
FIG. 16 illustrates a method 1600 of detecting an angular position of a magnet magnetized radially according to an embodiment of the present invention.

FIG. 16 illustrates a method 1600 of detecting an angular position of a magnet magnetized radially according to an embodiment of the present invention. Method 1600 comprises at a first step S1601, placing a magnetic angular sensor side-shafted to the magnet which is below the plane of the magnet and is in parallel to a rotatable axis of the magnet. Method 1600 further comprises at a second step S1602, detecting an axial magnetic field component in parallel to the axis, of the magnetic field vector where the sensor is placed, and detecting a tangential magnetic field component of the magnet field where the sensor is placed. Method 1600 further comprises at a third step S1603, detecting the angle orientation of the magnetic field vector in the sensing plane of the sensor. The angle orientation β can be calculated from the tangential magnetic field component Bt and the axial magnetic field component Bz with an equation of β=Arctan(Bt/Bz). In one embodiment, this calculation is fulfilled by a sensor as shown in FIG. 6, 7 or 13. And finally method 1600 comprises at a fourth step S1604, determining the angular position α of the magnet indicative of the differential angle between the magnetizing direction of the magnet and the sensor by matching from the angle orientation β of the magnetic field vector. In one embodiment, the method of matching from the angle orientation is fulfilled by adjusting the sensitivity ratios of the sensor for sensing the axial magnetic field component and the sensor for sensing the tangential magnetic field component. And in one embodiment, referring to FIG. 5, if the curve amplitude Btm for the tangential magnetic field component Bt is equal to the curve amplitude Bzm for the axial magnetic field component Bz, then the angular position of the magnet is equal to the angle orientation of the magnetic field vector.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

I claim:

1. A magnetic angular sensing system, comprising:
a magnet magnetized radially on a plane of the magnet, the magnet having a magnetizing direction from a north pole to a south pole of the magnet, and wherein the north pole and the south pole are located respectively at two opposite ends of the plane, wherein the magnet is rotatable around an axis perpendicular to the plane; and
a magnetic angular sensor having a sensing plane in parallel to the axis and perpendicular to a radius between the axis and the magnetic angular sensor that is not coplanar with the plane of the magnet, and wherein the magnetic angular sensor is configured to sense an axial magnetic field component of a magnetic field vector generated by the magnet at a first detection direction of the sensing plane in parallel to the axis and to sense a tangential magnetic field component of the magnetic field vector at a second detection direction of the sensing plane orthogonal to the radius and the axis, the magnetic angular sensor is configured to provide an angle signal indicative of the angular position of the magnet, and wherein the angle signal is generated according to the axial magnetic field component and the tangential magnetic field component; wherein the magnetic angular sensor comprises:
a first hall effect device configured to sense the axial magnetic field component at the first detection direction, the first hall effect device comprising a first pair and a second pair of connectors;
a second hall effect device configured to sense the tangential magnetic field component at the second detection direction orthogonal to the radius and the axis, the second hall effect device comprising a first pair and a second pair of connectors;
a current source having an output configured to provide an electrical current;
a filtering unit having an input and an output, wherein the filtering unit has a fundamental frequency f corresponding to a period Tf=1/f;
a wiring unit having a plurality of nodes coupled to the output of the current source, the pairs of connectors of the first and second hall effect devices and the input of the filtering unit, the wiring unit configured to selectively couple one pair of connectors of each of the first hall effect device and the second hall effect device to the output of the current source configured to allow a current flowing through each of the first and second hall effect devices, and couple the other pair of connectors of each of the first and second hall effect devices to the input of the filtering unit configured to provide a first hall voltage signal;

a control unit configured to control the wiring unit; and an output unit coupled to the output of the filtering unit and configured to provide the angle signal indicative of the angular position of the magnet.

2. The magnetic angular sensing system of claim 1, wherein the angle signal is indicative of a differential angle between the magnetizing direction and the radius.

3. The magnetic angular sensing system of claim 1, further comprising a computing circuit configured to generate an angle orientation β of a magnetic field vector at the magnetic angular sensor projected in the sensing plane by executing an operation of β=Arctan(Bt/Bz), where Bt is indicative of the tangential magnetic field component and Bz is indicative of the axial magnetic field component, and wherein the angular position of the magnet is obtained from the computed angle orientation β.

4. The magnetic angular sensing system of claim 1, wherein the control unit structured and configured to control the wiring unit in such a way that:

during a first time period of a duration 0.5Tf, controlling the first hall effect device with its first pair of connectors to receive the electrical current, its second pair of connectors to be coupled to the filter unit during a first 0.25Tf; and controlling the second hall effect device with its first pair of connectors to receive the electrical current, its second pair of connectors to be coupled to the filter unit during a next 0.25Tf; and during a second time period of duration 0.5Tf subsequent to the first time period, controlling the first hall effect device with its second pair of connectors to receive the electrical current, its first pair of connectors to be coupled to the filter unit during a first 0.25Tf; and controlling the second hall effect device with its second pair of connectors to receive the electrical current, its first pair of connectors to be coupled to the filter unit during a next 0.25Tf.

5. The magnetic angular sensing system of claim 1, wherein the output unit comprises:

a comparator having a first input coupled to the output of the filtering unit, and a second input coupled to a ground potential;

a phase detection unit having a first input coupled to the comparator, a second input configured to receive a pulse-width-modulation signal, a third input configured to receive a clock signal, and an output configured to provide the angle signal indicative of the angular position of the magnet.

6. The magnetic angular sensing system of claim 5, wherein the phase detection unit comprises:

a latch having a set input coupled to the comparator and a reset input configured to receive the pulse-width-modulation signal, and an output; and a counter having an input coupled to the output of the latch and an output configured to provide the angle signal indicative of the angular position of the magnet in relating to the magnetizing direction.

7. The magnetic angular sensing system of claim 1, further comprising:

a third hall effect device in parallel and rotated about 180° with respect to the first hall effect device, the third hall effect device comprising two pairs of connectors;

a fourth hall effect device in parallel and rotated about 180° with respect to the second hall effect device, the fourth hall effect device comprising two pairs of connectors;

a second wiring unit having a plurality of nodes coupled to the output of the current source, the pairs of connectors of the third and fourth hall effect devices, the second wiring unit configured to selectively couple one pair of connectors of each of the third and fourth hall effect devices to the output of the current source configured to allow a current flowing through each of the third and fourth hall effect devices and the other pair of connectors of each of the third and fourth hall effect devices configured to provide a second hall voltage signal, the second wiring unit configured to apply same wiring schemes to the third and fourth hall effect devices as the first and second hall effect devices; and a subtraction unit having a first input configured to receive the first hall voltage signal, a second input configured to receive the second hall voltage signal, and an output coupled to the input of the filtering circuit.

8. The magnetic angular sensing system of claim 1, wherein the filtering unit comprises a band pass filter having a quality factor Q of Q=π/2+−0.25.

9. The magnetic angular sensing system of claim 1, wherein the pair of connectors for each of the first and second hall effect devices are wired to the current source already before the beginning of the corresponding time period and during the time period, and the pair of connectors for each of the first and second hall effect devices are wired to the filtering unit during the corresponding time period and after the time period for a while.

10. A method of detecting an angular position of a magnet magnetized radially, the method comprising:

placing a magnetic angular sensor side-shafted to the magnet which is below the plane of the magnet and is in parallel to a rotatable axis of the magnet;

detecting an axial magnetic field component and a tangential magnetic field component of a magnet field vector where the sensor is placed;

detecting an angle orientation of the magnetic field vector projected in a sensing plane of the sensor, wherein the sensing plane is at the plane of the tangential magnetic field component and the axial magnetic field component; and determining the angular position of the magnet indicative of the differential angle between the magnetizing direction of the magnet and the sensor based on the angle orientation of the magnetic field vector; wherein the angle orientation is detected by:

a first hall effect device for detecting the axial magnetic field component, the first hall effect device comprising a first pair and a second pair of connectors;

a second hall effect device for detecting the tangential magnetic field component, the second hall effect device comprising a first pair and a second pair of connectors;

a wiring unit for coupling one pair of connectors for each of the first and second hall effect devices to a current source to allow a current flowing through each of the first and second hall effect devices and coupling the other pair of connectors for each of the first and second hall effect devices to an filtering unit configured to provide a hall voltage signal indicative of the angle orientation, wherein the filtering unit has a fundamental frequency f corresponding to a period Tf=1/f;

controlling the wiring unit in such a way that:

during a first time period of a duration 0.5Tf, controlling the first hall effect device with its first pair of connectors to receive the electrical current, its second pair of connectors to be coupled to the filter unit during a first 0.25Tf; and controlling the second hall effect device with its first pair of connectors to receive the electrical current, its second pair of connectors to be coupled to the filter unit during a next 0.25Tf; and during a second time period of duration 0.5Tf subsequent to the first time period, controlling the first hall effect device with its second pair of connectors to receive the electrical current, its first pair of connectors to be coupled to the filter unit during a first 0.25Tf; and controlling the second hall effect device with its second pair of connectors to receive the electrical current, its first pair of connectors to be coupled to the filter unit during a next 0.25Tf.

11. The method of claim 10, wherein the angle orientation β is calculated from the tangential magnetic field component Bt and the axial magnetic field component Bz solving β=Arctan(Bt/Bz).

12. A magnetic angular sensor used in a sensing system, wherein the sensing system comprises a magnet magnetized radially on a plane of the magnet, and rotatable around an axis perpendicular to the plane, the magnetic angular sensor having a sensing plane in parallel to the axis and perpendicular to a radius between the axis and the magnetic angular sensor that is not coplanar with the plane, the magnetic angular sensor comprising:

a first hall effect device configured to sense an axial magnetic field component of a magnetic field vector generated by the magnet at a first detection direction of the sensing plane in parallel to the axis;

a second hall effect device configured to sense a tangential magnetic field component of the magnetic field vector at a second detection direction of the sensing plane orthogonal to the radius and the axis; and a processing unit configured to provide an angle signal indicative of an angular position of the magnet based on the axial magnetic field component and the tangential magnetic field component; wherein the first hall effect device and the second hall effect device each has two pairs of connectors, and wherein the processing unit comprises:

a current source configured to provide an electrical current;

a filtering unit having a fundamental frequency f corresponding to a period Tf=1/f;

a control unit configured to control a wiring unit so that one pair of connectors of each of the first hall effect device and the second hall effect device is configured to receive the electrical current, and the other pair of connectors of each of the first and second hall effect devices is configured to generate a first hall voltage signal via the filtering unit; and an output unit coupled to the filtering unit and configured to provide the angle signal.

13. The magnetic angular sensor of claim 12, wherein the control unit is controlled in such a way that:

during a first time period of a duration 0.5Tf, controlling the first hall effect device with its first pair of connectors to receive the electrical current, its second pair of connectors to be coupled to the filter unit during a first 0.25Tf; and controlling the second hall effect device with its first pair of connectors to receive the electrical current, its second pair of connectors to be coupled to the filter unit during a next 0.25Tf; and during a second time period of duration 0.5Tf subsequent to the first time period, controlling the first hall effect device with its second pair of connectors to receive the electrical current, its first pair of connectors to be coupled to the filter unit during a first 0.25Tf; and controlling the second hall effect device with its second pair of connectors to receive the electrical current, its first pair of connectors to be coupled to the filter unit during a next 0.25Tf.

14. The magnetic angular sensor of claim 12, wherein the output unit comprises:

a comparator having a first input coupled to the filtering unit, and a second input coupled to a ground potential;

a latch having a set input coupled to the comparator and a reset input configured to receive the pulse-width-modulation signal; and a counter coupled to the latch to provide the angle signal.

15. The magnetic angular sensor of claim 12, further comprising:

a third hall effect device in parallel and rotated about 180° with respect to the first hall effect device, the third hall effect device comprising two pairs of connectors;

a fourth hall effect device in parallel and rotated about 180° with respect to the second hall effect device, the fourth hall effect device comprising two pairs of connectors;

a second wiring unit configured to selectively allow one pair of connectors of each of the third and fourth hall effect devices to receive the electrical current, and allow the other pair of connectors of each of the third and fourth hall effect devices configured to generate a second hall voltage signal; and a subtraction unit having a first input configured to receive the first hall voltage signal, a second input configured to receive the second hall voltage signal, and an output coupled to the filtering circuit.

* * * * *